(12) United States Patent
Olofsson

(10) Patent No.: US 7,022,560 B2
(45) Date of Patent: Apr. 4, 2006

(54) METHOD TO MANUFACTURE HIGH VOLTAGE MOS TRANSISTOR BY ION IMPLANTATION

(75) Inventor: Peter Olofsson, Stenhamra (SE)

(73) Assignee: Infineon Technologies AG, Munich (DE)

( * ) Notice: Subject to any disclaimer, the term of this patent is extended or adjusted under 35 U.S.C. 154(b) by 102 days.

(21) Appl. No.: 10/853,508

(22) Filed: May 25, 2004

(65) Prior Publication Data

US 2004/0241950 A1    Dec. 2, 2004

Related U.S. Application Data

(63) Continuation of application No. PCT/SE02/02242, filed on Dec. 5, 2002.

(30) Foreign Application Priority Data

Dec. 11, 2001    (SE) .................................... 0104164

(51) Int. Cl.
  *H01L 21/337*    (2006.01)
  *H01L 21/336*    (2006.01)

(52) U.S. Cl. ..................... 438/163; 438/194; 438/197; 438/282; 438/289

(58) Field of Classification Search ................ 438/163, 438/194, 197, 282, 289
See application file for complete search history.

(56) References Cited

U.S. PATENT DOCUMENTS

| 5,146,298 | A  | * | 9/1992  | Eklund ........................ 257/378 |
| 5,286,995 | A  |   | 2/1994  | Malhi ......................... 257/549 |
| 5,854,099 | A  |   | 12/1998 | Farrenkopf .................. 438/201 |
| 5,985,705 | A  | * | 11/1999 | Seliskar .................... 438/197 |
| 6,069,034 | A  |   | 5/2000  | Gregory ..................... 438/201 |
| 6,225,181 | B1 |   | 5/2001  | Gregory ..................... 438/355 |

* cited by examiner

*Primary Examiner*—William M. Brewster
(74) *Attorney, Agent, or Firm*—Baker Botts L.L.P.

(57) ABSTRACT

A method for fabrication of a high-voltage, high-frequency MOS-transistor combines a deep n-well and a p-well process and the formation of an extended drain region (45), and a channel region (31), the channel having a short length and becoming well aligned with the gate edge. The deep n-well (11) and the p-well (19) are both produced by ion implantation. The method is compatible with a standard CMOS process and gives low manufacturing costs, increased breakdown voltage, better overall high-frequency performance, and the prevention of the "body effect" occurring by isolation of the p-well.

20 Claims, 5 Drawing Sheets

METHOD TO MANUFACTURE HIGH VOLTAGE MOS TRANSISTOR BY ION IMPLANTATION

CROSS REFERENCE TO RELATED APPLICATION

Figure 1:
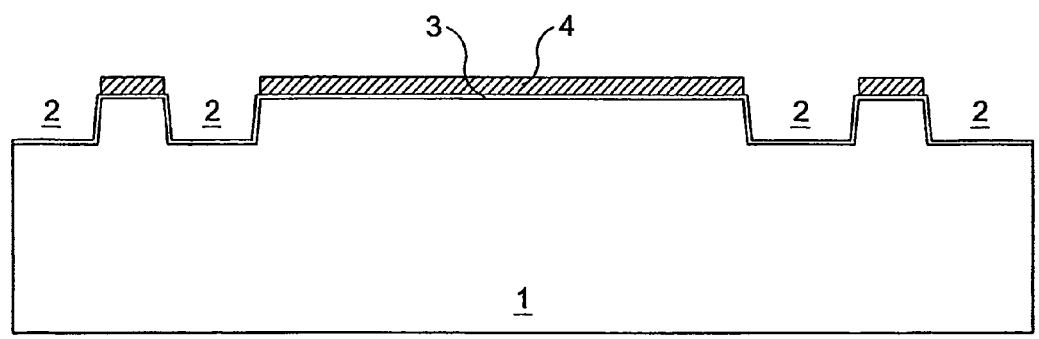

This application is a continuation of International Application No. PCT/SE02/02242 filed Dec. 5, 2002 which designates the United States, and claims priority to Swedish application no. 0104164-9 filed Dec. 11, 2001.

TECHNICAL FIELD OF THE INVENTION

The present invention generally relates to a method of fabricating a high voltage, high transition frequency MOS transistor in a low voltage CMOS process.

BACKGROUND OF THE INVENTION

The increasing demand for information capacity of CMOS components requires a continuously higher packing density and higher speed in the circuits and thus a shrinking of the line-widths, distances and layer thicknesses.

The shrinking line width also calls for lower supply voltages and signal voltages. For digital components this is a benefit since it saves electrical power, while noise margins are relatively large. However, in analog high frequency circuits noise margins are a concern. Modern, low voltage CMOS processes cannot withstand the voltage levels needed to preserve signal-to-noise ratios in high performance analog circuits.

Lateral DMOS structures have previously been used in for example RF power amplifiers, by combining high breakdown voltage with good high frequency performance. In these structures, the channel area has been diffused from the edge of e.g. the gate structure. Such a provision needs an additional annealing step, which may not be compatible with a standard CMOS process flow since the thermal budget in many processes is very limited. Furthermore, an optimal doping gradient in the channel area is not obtained since the highest channel doping is automatically obtained closest to the source area.

The breakdown voltage of the MOS transistor can be increased by means of the so-called extended drain technique. For an NMOS transistor, the active area is defined in a p-well region. In this region, an n-area is formed to define an extended drain area that may be depleted when the drain voltage is increased.

A further improvement may be achieved by employing a buried N-type layer that has the function of isolating the active p-well region of the transistor from the substrate. This has earlier been incorporated using epitaxy together with the extended drain technique in the isolated RESURF LDMOS (REduced SURface Field Lateral Double-diffused MOS) transistor for so-called "high side driver" applications as disclosed in U.S. Pat. No. 5,286,995.

SUMMARY OF THE INVENTION

It is an object of the invention to combine a cost-effective, deep isolation n-well process with a high performance extended drain technique and the formation of a MOS channel highly aligned with the gate edge.

The method of n– or p-well formation preferred herein is ion implantation.

The manufactured structure will exhibit the following benefits:

It is compatible with the standard CMOS fabrication process with only three extra implants and associated masks needed. The manufacturing process has a lower cost compared to techniques using epitaxy.

It has an increased breakdown voltage. The extended drain region will be depleted at high drain-to-source voltages and the maximum electric field at the gate edge will become lower.

It has improved high frequency performance due to the short channel length. The structure can support very short channel length due to the self-aligned channel definition.

It has better noise isolation from the substrate. The isolation of the active p-well region also prevents the "body effect" from occurring, i.e. when, for an N-type device, the gate bias must be set more positive for a given source current.

BRIEF DESCRIPTION OF THE INVENTION

Figure 2:
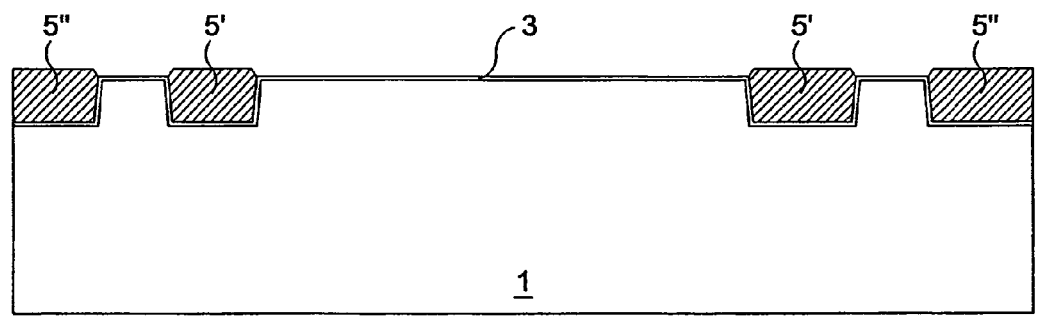
Figure 3:
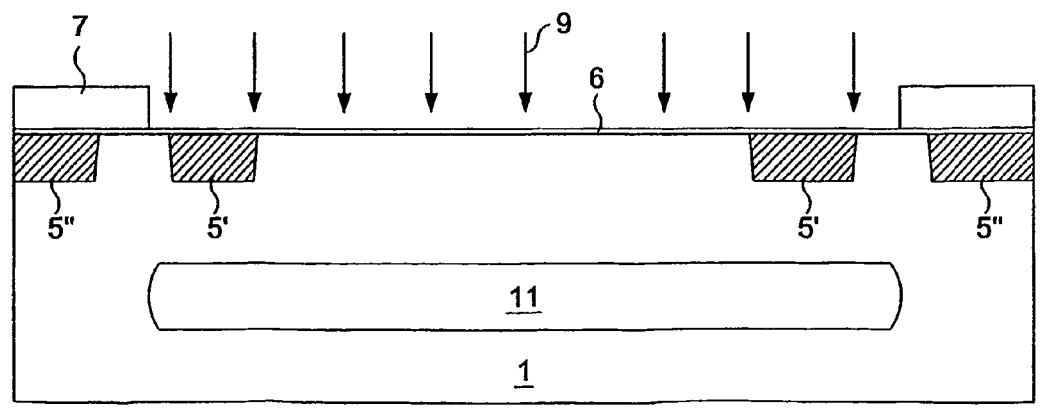
Figure 4:
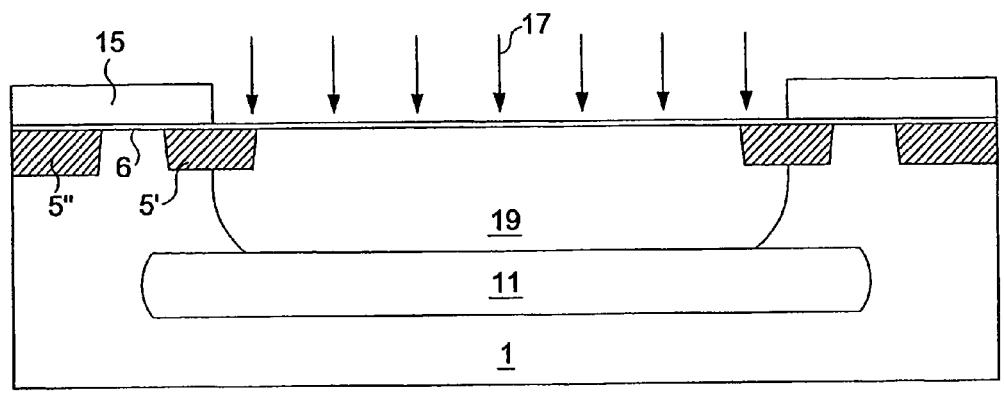
Figure 5:
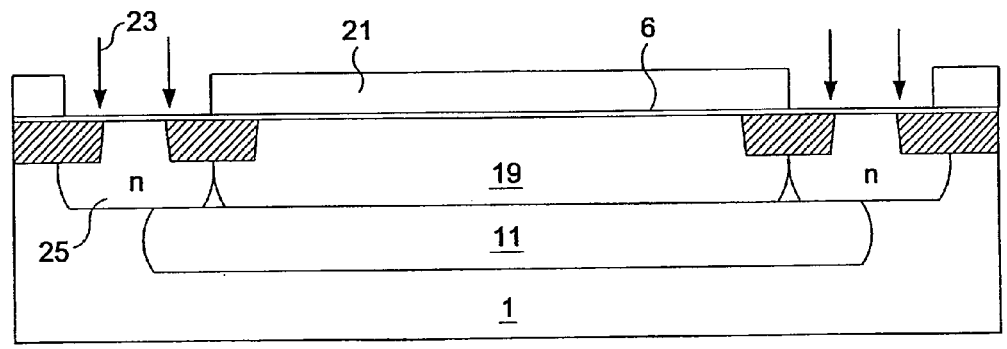
Figure 6:
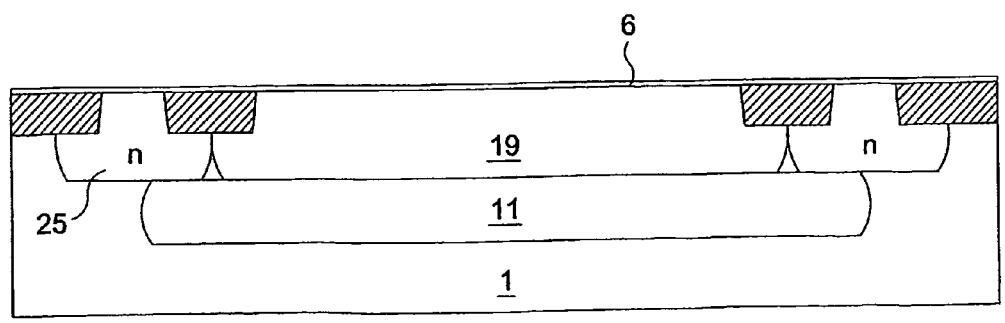
Figure 7:
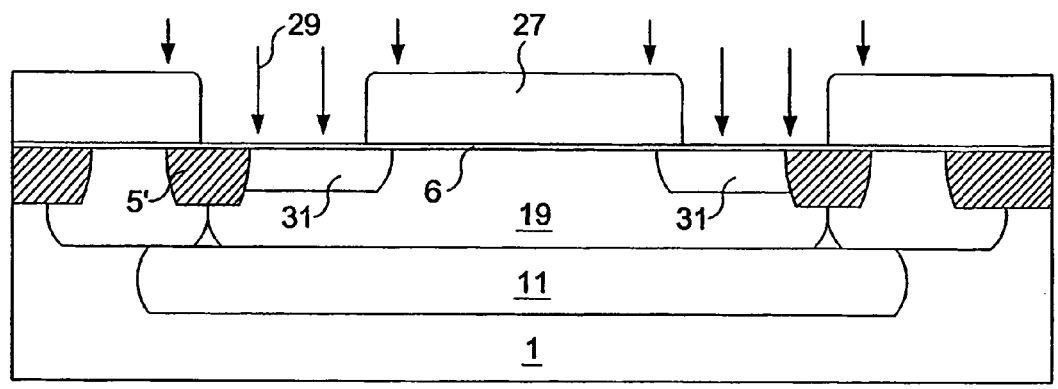
Figure 8:
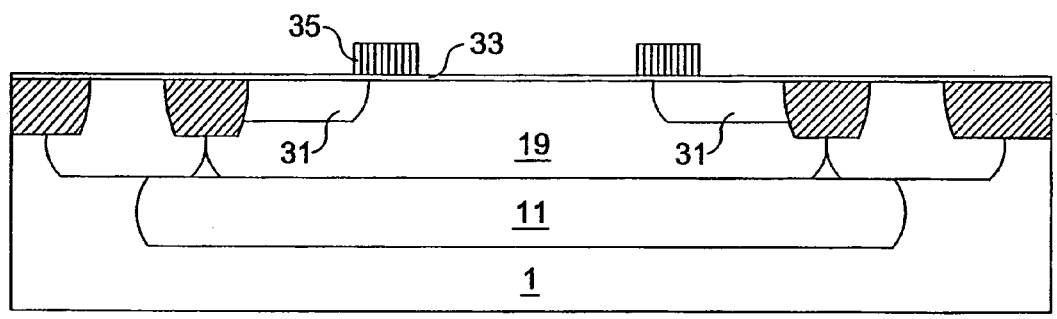
Figure 9:
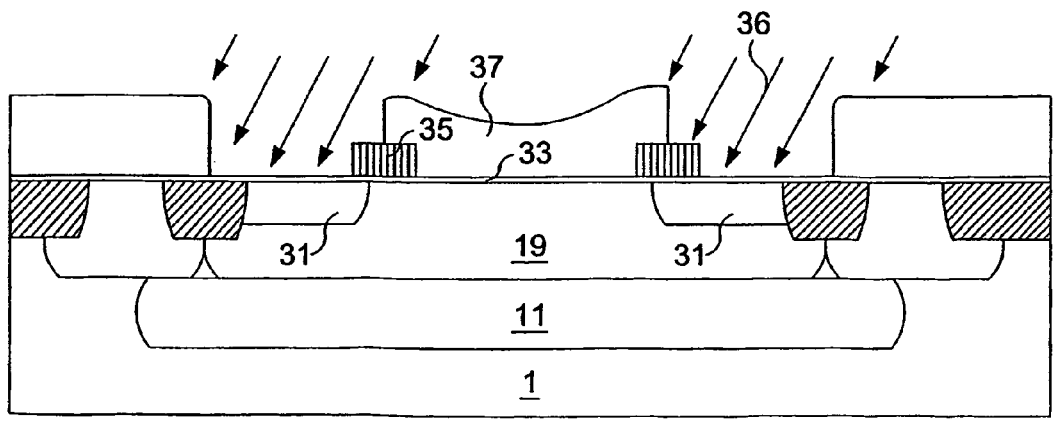
Figure 10:
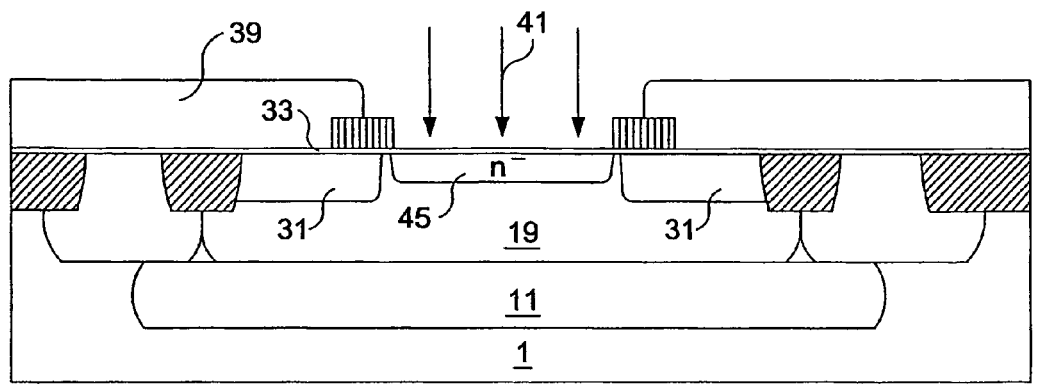
Figure 11:
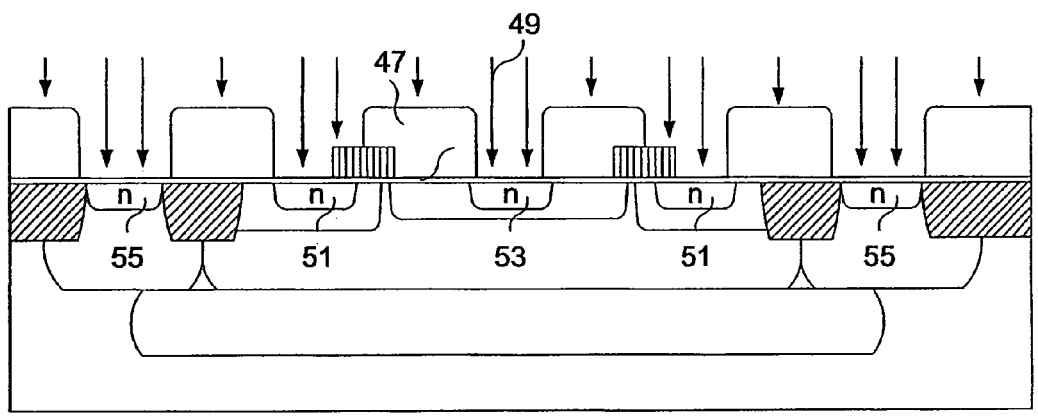
Figure 12:
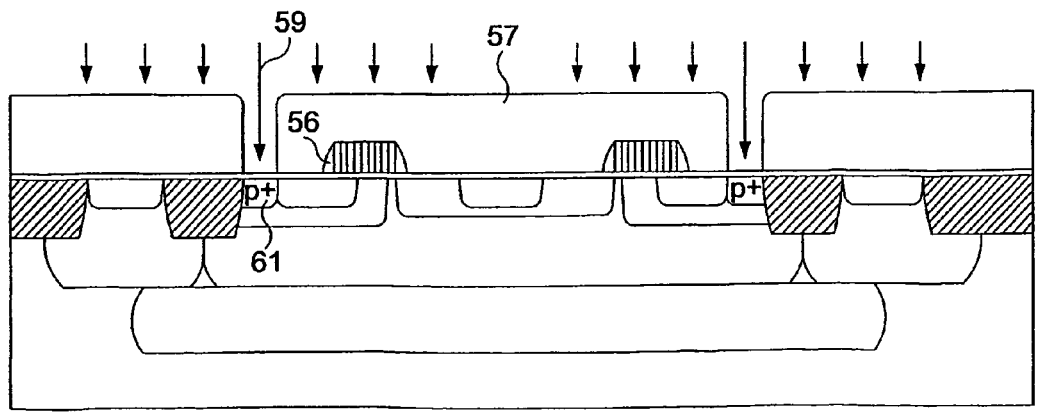
Figure 13:
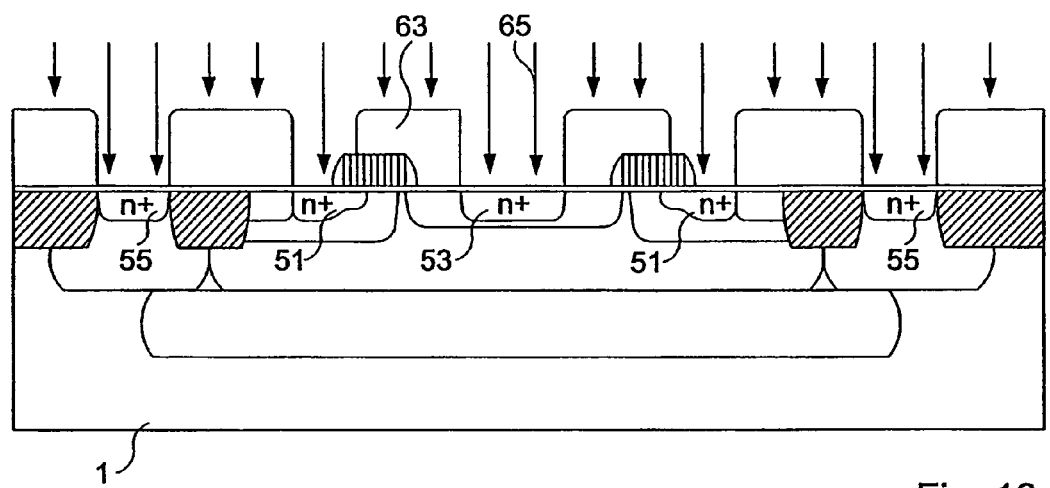
Figure 14:
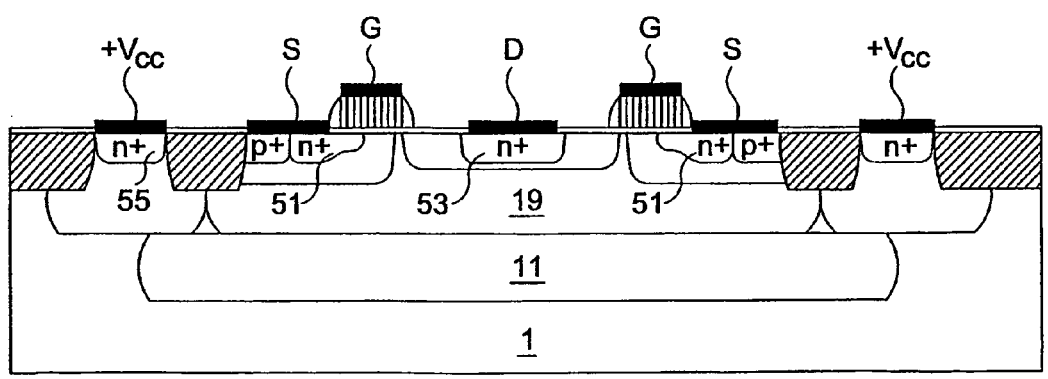

The accompanying FIGS. 1–14 are given for illustrating an embodiment of the invention by way of example only and are not to be thought of as limiting. All figures show enlarged, schematic cross-sectional views of a substrate at different stages of a manufacturing process and in particular some of the vertical dimensions are relatively too large. In the drawings:

FIG. 1 is a sectional view of a p-substrate having etched STI trenches,

FIG. 2 is a sectional view of the resulting structure having filled trenches after a CMP has been performed, FIG. 3 is a sectional view of the substrate illustrating the implanting of a deep n-well, FIG. 4 is a sectional view of the substrate in a step of implanting an additional high voltage p-well, FIG. 5 is a sectional view of the substrate illustrating implantation of n-well regions used as contact regions for the deep n-well, FIG. 6 is a sectional view of the substrate illustrating the resulting structure including the p-well and n-well regions, FIG. 7 is a sectional view of the substrate illustrating a step of forming a channel area, FIG. 8 is a sectional view of the substrate illustrating formation of gate areas, FIG. 9 is a sectional view of the substrate illustrating an alternative way of channel formation using angled implantation, FIG. 10 is a sectional view of the structure after forming an implanted extended drain region, FIG. 11 is a sectional view of the substrate illustrating a step of implantation of weakly doped n-regions, FIG. 12 is a sectional view of the substrate illustrating implantation of a p$^+$ area used as contact to backgate areas, FIG. 13 is a sectional view of the substrate illustrating implantation of source, drain and deep n-well contact areas, and FIG. 14 is a sectional view of the resulting structure that includes source, drain and gate areas with silicide formed on the contact areas.

DESCRIPTION OF THE INVENTION

In the following a particular example will be described in order to gain an understanding of relevant techniques of the present invention. Such details that may be known by one skilled in the art have been omitted. Apparently, there are many other embodiments of the invention that may depart from specific details in this particular description. One such example is the fabrication of a p-type device by reversing all dopings.

In FIG. 1 a high resistivity p-type silicon substrate 1 is illustrated that is prepared for a shallow trench isolation (STI) process and comprises etched trenches 2. The trenches surround an area inside of which a MOS transistor will be formed. Outside the trenches, further etched areas have been produced, leaving a non-etched strip also extending around the area in which the transistor is to be formed. An STI liner oxide 3 has been grown over the surface of the substrate and a mask 4 of silicon nitride has been applied on top thereof to provide for the subsequent filling of the trenches 2 by silicon oxide as illustrated in FIG. 2. After the filling of this oxide has been carried out, producing inner and outer areas 5' and 5" of STI oxide, respectively, a chemical mechanical planarization (CMP) of the substrate surface is performed. Following the CMP step, a thin oxide 6 is grown on the exposed silicon areas as illustrated in FIG. 3.

Also as shown in FIG. 3, another mask 7 is then applied having a window in the area in which the MOS transistor is to be formed and phosphorus of relatively high energy, 900 keV, and a dose of $2 \times 10^{13}$ cm$^{-2}$, is implanted as indicated by the arrows 9. The implantation is made in the conventional way, in a small tilt angle such as 7° to the normal of the surface of the substrate 1 to avoid channeling. The implantation produces a deep n-well 11 in the window of the mask. The depth of the n-well peak profile is about 1 μm, which is determined by the implantation energy. The mask 7 is then removed.

As seen in FIG. 4 a mask 15 is then applied defining an opening inside that of the previous mask 7 for the deep n-well region 11, the opening having e.g. edges located at the approximate center lines of the top surfaces of the inner STI oxide areas 5'. Boron is then implanted as indicated by arrows 17 in a dose of $1 \times 10^{13}$ cm$^{-2}$, an energy of 220 keV and a tilt angle of 7°. The parameters of this implanting step are thus set to produce a high voltage p-well 19 located above the deep n-well 11 as seen in FIG. 4. In this way, the p-well 19 obtains a high electric isolation from electronic currents and voltages outside the doped areas. Also, the extended drain described hereinafter will protect the gate and source of the transistor to be produced against high voltages of the p-well. The p-well can have its vertical sides located at the approximate center lines of the bottom surfaces of the inner STI areas 5'. The mask layer 15 is then removed.

As a next step, a mask 21 is applied according to FIG. 5. This mask has openings only in those areas which are located right above the end portions of the deep n-well region 11 including those parts of the substrate surface which are located between the inner 5' and the outer 5" STI areas. Phosphorus is implanted through the openings of the mask as indicated by arrows 23. This implantation step is divided into three substeps having different characteristics. In the first substep, phosphorus having a dopant dose of $2 \times 10^{13}$ cm$^{-2}$, an energy of 490 keV and a tilt angle of 0° is implanted, and it thus penetrates deep into the substrate. In the second substep, the phosphorus has a dose of $4 \times 10^{12}$ cm$^{-2}$, an energy of 140 keV and a tilt of 7° and in the third substep $3.7 \times 10^{12}$ cm$^{-2}$, 50 keV and 7°, respectively. This implantation thus produces relatively highly n-doped areas 25 located in the surface regions of the p-substrate between the inner and outer STI areas 5', 5" and extending down to the deep n-well 11 and acting as contact plugs for the deep n-well. The result after removing the mask layer 21 is shown in FIG. 6. Contact regions of type n$^+$ will be implanted at the top of these plug regions for connection of a bias voltage to the deep n-well 11, as will be described below. This n-type doping step is identical to the n-well formation when combining the manufacture of the device into a standard CMOS process flow.

Two alternatives in forming the gates and the associated channels are next to be described. The first alternative begins with the channel formation by applying a mask 27 according to FIG. 7. This mask exposes the strip-shaped regions extending between the inner STI oxide areas 5' and the areas where the gates subsequently are to be located, the regions extending also some distance over the inner STI oxide areas. The implantation, illustrated by arrows 29, is made in two substeps. In the first substep, only boron is used for implantation and in the second substep boron difluoride BF$_2$ is used. The characteristics of these implantations are, for only boron, a dopant dose of $6 \times 10^{12}$ cm$^{-2}$, an energy of 60 keV and a tilt angle of 7°, and, correspondingly, for boron difluoride, $5 \times 10^{12}$ cm$^{-2}$, 50 keV and 7°. The implantations create p-doped channel areas 31, self-aligned with the inner edge of the inner STI field oxide areas 5'. The mask 27 is then removed. At this stage, all the needed well areas for the device have been formed, and the thin oxide 6 is stripped off all over the surface. This oxide layer has been renewed in the exposed areas before each of the implantation steps described above has been carried out.

Then, as shown in FIG. 8, a thin gate oxide 33 is grown over the whole surface of the substrate, and a highly doped polysilicon layer for the gates is deposited on top thereof. A mask, not shown, is used to define the gates 35. In the sectional view of FIG. 8 two symmetrically located gate areas are seen, either being parts of two individual MOS transistors or being joined to form a single, connected area and then belonging to the same MOS transistor. These gates are produced by etching through the openings of the mask and the mask is then removed. The thin gate oxide layer located outside the gate is kept in order to protect against breakdown between gate and source/drain.

In the second alternative, as shown in FIG. 9, the channel implant is performed subsequently to the gate formation. The latter step is the same as described above, illustrated in FIG. 8, but now excluding the p-channel regions. For the subsequent channel formation a mask 37 which extends up to the center line of the gates 35 is used to protect the drain area. An angled implant 36 of boron is used to place the junction edge under the gate 35. An advantage of this method is the improved control of the channel length determined by the implant energy and angle. The tilt angle can here be chosen to be substantially 48° in four independent directions relative to the normal of the substrate surface, i.e. the tilt angle is achieved in a so called quad arrangement. The implantation is otherwise performed in two substeps, the first substep involving a dose of $6 \times 10^{12}$ cm$^{-2}$ and an energy of 60 keV and the second substep a dose of $4 \times 10^{12}$ cm$^{-2}$ and an energy of 10 keV.

Having performed either of these two alternatives of channel formation, a new mask 39 is thereupon applied having a window placed substantially centrally above the p-well 19, its edges being located on top of the gate areas 35, as shown in FIG. 10. Next, phosphorus is implanted in the window as indicated by the arrows 41, the implanting being made with a dopant dose of $6 \times 10^{12}$ cm$^{-2}$, a particle energy of 50 keV and a tilt angle of 10° in a quad configuration as defined above. The result of the implantation is an extended drain region 45, which is a weakly doped n-region located at the surface, centrally in the p-well, and extending from one side of, in the example shown between, and partly below the gate areas 35, this doped region having a relatively small depth.

After removing the mask 39, as shown in FIG. 11, a new mask 47 is applied to prepare for an n-doped lightly doped drain and a pocket implant of weakly doped n-regions, the opening of the mask defining where the source, drain and sinker connections are to be located. Thus, phosphorus is first implanted in a dose of $5\times10^{12}$ cm$^{-2}$, an energy of 30 keV and a tilt angle of 10° in a quad configuration, and then arsenic of dose $2\times10^{14}$ cm$^{-2}$, energy 20 keV and a tilt angle of 7°, also in a quad configuration, the implanting being indicated by arrows 49. The resulting n-regions 51, 53 and 55 for source, drain and sinker, respectively, are also seen in FIG. 11. The mask 47 is then removed.

In connection with the implanting of the source, drain and sinker regions, thin oxide is always deposited in the exposed regions. Also silicon nitride is now to be deposited, all steps not shown. Most of the nitride is then removed by anisotropic etching, only leaving spacers 56 on the sidewalls of the gate areas. Another selective step using a mask 57 is then performed as shown in FIG. 12, followed by a p$^+$-type implantation of boron in the openings of the mask, indicated by the arrows 59. The characteristic data of the implantation are a dopant dose of $2\times10^{15}$ cm$^{-2}$, an energy of 5 keV and a quad tilt angle of 7°. As a result, contacts to the channel areas 61 are obtained. This implant is identical to the p$^+$ source/drain implant in a standard CMOS process flow. The mask 57 is then removed.

After that, a mask 63 for the combined n$^+$ implant and diffusion is applied. Arsenic is now implanted as indicated by arrows 65 in FIG. 13, producing the final shapes of the source 51, drain 53 and sinker 55 regions. The corresponding implant characteristics in this case are $4\times10^{15}$ cm$^{-2}$, 60 keV and 7° quad.

The final structure after having removed the mask 63 is shown in FIG. 14. It is advantageous to create a layer of silicide, a metal-silicon compound, on top of the implanted gate, source, drain and sinker regions. By e.g. using a Salicide (Self-Aligned Silicide) process the silicide becomes self aligned with the earlier formed spacers and the series resistance to the regions covered is also reduced. After that, contacts are applied to the gate, source, drain and sinker areas. As mentioned above, the relatively highly n-doped areas 25 in the surface regions of the p-substrate act as contact regions for the deep n-well. Thus, by providing a positive voltage +V$_{cc}$ to the sinker contacts on top of the n-region 25, the parasitic pnp-transistor defined by the p-well 19, the deep n-well 11 and the p-substrate 1 becomes reverse biased, which improves the isolation characteristics of the MOS structure.

I claim:

1. A method of manufacturing a high voltage, high speed MOS transistor, comprising the steps of:
    forming in a semiconductor substrate of a first conductivity type a buried first well region of a second conductivity type, wherein the first well region is formed by high energy implantation to locate the first well region deep within the substrate,
    forming a second well region of the first conductivity type between the surface of the substrate and the first well region, wherein the second well region is formed by high energy implantation to locate the second well region between the surface of the substrate and the first well region,
    forming channel areas of the first conductivity type by ion implantation inside the second well region,
    forming gate regions on the surface of the substrate,
    forming a weakly doped extended drain region by ion implantation inside the second well region,
    forming source, drain and sinker regions having a heavy doping of the second conductivity type, the source regions being formed within the channel areas, and
    forming contact plugs of the second conductivity type extending from the surface of the substrate to the first well region by ion implantation.

2. The method according to claim 1, wherein the first well region is formed by ion implantation of phosphorus.

3. The method according to claim 1, wherein the second well region is formed by ion implantation of boron.

4. The method according to claim 2, wherein the second well region is formed by ion implantation of boron.

5. The method according to claim 3, wherein the ion implantation of boron is performed at a dose of substantially $10^{13}$ cm$^{-2}$, at an energy of substantially 220 keV and with the direction of implantation at an angle of substantially 7° with respect to a direction perpendicular to the surface of the substrate.

6. The method according to claim 4, wherein the ion implantation of boron is performed at a dose of substantially $10^{13}$ cm$^{-2}$, at an energy of substantially 220 keV and with the direction of implantation at an angle of substantially 7° with respect to a direction perpendicular to the surface of the substrate.

7. The method according to claim 1, wherein the contact plugs are formed by ion implantation of phosphorus in three successive steps.

8. The method according to claim 7, wherein a first step comprises implantation of phosphorus at a dose of substantially $2\times10^{13}$ cm$^{-2}$, an energy of substantially 490 keV and with the substrate tilted an angle of substantially 0° with respect to the direction of implantation, a second step comprises implantation of phosphorus at a dose of substantially $4\times10^{13}$ cm$^{-2}$, an energy of substantially 140 keV and with the substrate tilted an angle of substantially 7° with respect to the direction of implantation, and a third step comprises implantation of phosphorus at a dose of substantially $3.7\times10^{13}$ cm$^{-2}$, an energy of substantially 50 keV and with the substrate tilted an angle of substantially 7° with respect to the direction of implantation.

9. The method according to claim 1, wherein the channel areas are formed by ion implantation of boron and boron difluoride in successive steps.

10. The method according to claim 9, wherein a first step comprises implanting boron at a dose of substantially $6\times10^{12}$ cm$^{-2}$, an energy of substantially 60 keV and with the substrate tilted an angle of substantially 7° with respect to the direction of implantation, a second step comprises implanting boron difluoride at a dose of substantially $5\times10^{12}$ cm$^{-2}$, an energy of substantially 50 keV and with the substrate tilted an angle of substantially 7° with respect to the direction of implantation.

11. The method according to claim 1, wherein the extended drain area is formed by ion implantation of phosphorus.

12. The method according to claim 11, wherein the ion implantation of phosphorus is performed at a dose of substantially $6\times10^{12}$ cm$^{-2}$, at an energy of substantially 50 keV and with the substrate tilted an angle of substantially 10° with respect to the direction of implantation, and rotated into four symmetric directions in a quad configuration.

13. A method of manufacturing a high voltage, high speed MOS transistor, comprising the steps of:

forming in a semiconductor substrate of a first conductivity type a buried first well region of a second conductivity type, wherein the first well region is formed by ion implantation of phosphorus to locate the first well region deep within the substrate, forming a second well region of the first conductivity type between the surface of the substrate and the first well region, wherein the second well region is formed by ion implantation of boron to locate the second well region between the surface of the substrate and the first well region, forming channel areas of the first conductivity type by ion implantation inside the second well region, forming gate regions on the surface of the substrate, forming a weakly doped extended drain region by ion implantation inside the second well region, forming source, drain and sinker regions having a heavy doping of the second conductivity type, the source regions being formed within the channel areas, and forming contact plugs of the second conductivity type extending from the surface of the substrate to the first well region by ion implantation.

14. The method according to claim 13, wherein the ion implantation of boron is performed at a dose of substantially $10^{13}$ cm$^{-2}$, at an energy of substantially 220 keV and with the direction of implantation at an angle of substantially 7° with respect to a direction perpendicular to the surface of the substrate.

15. The method according to claim 13, wherein the contact plugs are formed by ion implantation of phosphorus in three successive steps.

16. The method according to claim 15, wherein a first step comprises implantation of phosphorus at a dose of substantially $2\times10^{13}$ cm$^{-2}$, an energy of substantially 490 keV and with the substrate tilted an angle of substantially 0° with respect to the direction of implantation, a second step comprises implantation of phosphorus at a dose of substantially $4\times10^{13}$ cm$^{-2}$, an energy of substantially 140 keV and with the substrate tilted an angle of substantially 7° with respect to the direction of implantation, and a third step comprises implantation of phosphorus at a dose of substantially $3.7\times10^{13}$ cm$^{-2}$, an energy of substantially 50 keV and with the substrate tilted an angle of substantially 7° with respect to the direction of implantation.

17. The method according to claim 13, wherein the channel areas are formed by ion implantation of boron and boron difluoride in successive steps.

18. The method according to claim 17, wherein a first step comprises implanting boron at a dose of substantially $6\times10^{12}$ cm$^{-2}$, an energy of substantially 60 keV and with the substrate tilted an angle of substantially 7° with respect to the direction of implantation, a second step comprises implanting boron difluoride at a dose of substantially $5\times10^{12}$ cm$^{-2}$, an energy of substantially 50 keV and with the substrate tilted an angle of substantially 7° with respect to the direction of implantation 19. The method according to claim 13, wherein the extended drain area is formed by ion implantation of phosphorus.

20. The method according to claim 19, wherein the ion implantation of phosphorus is performed at a dose of substantially $6\times10^{12}$ cm$^{-2}$, at an energy of substantially 50 keV and with the substrate tilted an angle of substantially 10° with respect to the direction of implantation, and rotated into four symmetric directions in a quad configuration.

* * * * *